(12) United States Patent
Yan et al.

(10) Patent No.: US 12,251,878 B2
(45) Date of Patent: *Mar. 18, 2025

(54) FLEXIBLE PIEZOELECTRIC SENSOR BASED ON 4D PRINTING

(71) Applicant: HUAZHONG UNIVERSITY OF SCIENCE AND TECHNOLOGY, Hubei (CN)

(72) Inventors: Chunze Yan, Hubei (CN); Hongzhi Wu, Hubei (CN); Bin Su, Hubei (CN); Yusheng Shi, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/391,682

(22) Filed: Dec. 21, 2023

(65) Prior Publication Data

US 2024/0157649 A1   May 16, 2024

Related U.S. Application Data

(62) Division of application No. 17/037,745, filed on Sep. 30, 2020, now Pat. No. 11,938,680.

(30) Foreign Application Priority Data

Mar. 9, 2020   (CN) .......................... 202010158697.0

(51) Int. Cl.
*B29C 64/386*   (2017.01)
*B22F 10/18*   (2021.01)
(Continued)

(52) U.S. Cl.
CPC ............ *B29C 64/386* (2017.08); *B22F 10/18* (2021.01); *B22F 10/28* (2021.01); *B22F 10/38* (2021.01); *B22F 12/30* (2021.01); *B29C 64/153* (2017.08); *B29C 64/307* (2017.08); *B33Y 80/00* (2014.12); *H10N 30/302* (2023.02); *H10N 35/80* (2023.02); *B22F 10/12* (2021.01); *Y10T 29/42* (2015.01)

(58) Field of Classification Search
CPC ....... B33Y 10/00; B33Y 80/00; B29C 64/386; B29C 69/00; B29C 64/307; Y10T 29/42
USPC .. 29/25.35, 592.1, 603.08, 603.14, 846, 729
See application file for complete search history.

(56) References Cited

U.S. PATENT DOCUMENTS 11,014,268 B2 *   5/2021   Tseng .................. D01F 1/10
11,547,347 B2 *   1/2023   Dagdeviren ......... H10N 30/084

* cited by examiner

*Primary Examiner* — Thiem D Phan
(74) *Attorney, Agent, or Firm* — JCIP GLOBAL INC.

(57) ABSTRACT

The disclosure belongs to the technical field of additive manufacturing, and discloses a flexible piezoelectric sensor based on 4D printing. The sensor includes a magnetic part and a conductive part, wherein: the conductive part includes two substrates disposed opposite to each other and a spiral structure disposed between the two substrates. Both the two substrates and the spiral structure are made of conductive metal materials. The magnetic part has a flexible porous structure and is arranged between the two substrates to generate a magnetic field. When the two substrates are subjected to external pressure, the spiral structure and the magnetic part are compressed simultaneously, the magnetic flux passing through the spiral structure changes, and the voltage of the two substrates changes, by measuring the voltage change of the two substrates to reflect the change of external pressure, the pressure measuring process is achieved.

6 Claims, 4 Drawing Sheets

(51) Int. Cl.
*B22F 10/28* (2021.01)
*B22F 10/38* (2021.01)
*B22F 12/30* (2021.01)
*B29C 64/153* (2017.01)
*B29C 64/307* (2017.01)
*B33Y 80/00* (2015.01)
*H10N 30/30* (2023.01)
*H10N 35/80* (2023.01)
*B22F 10/12* (2021.01)

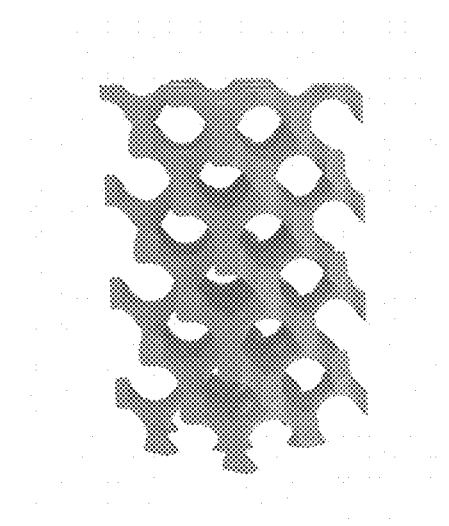
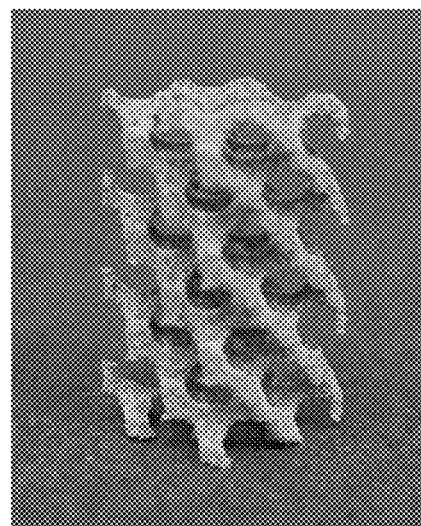
FIG. 3A    FIG. 3B
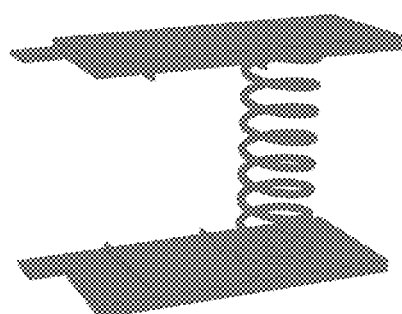
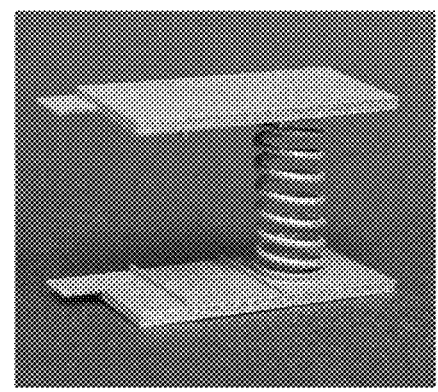
FIG. 4A    FIG. 4B
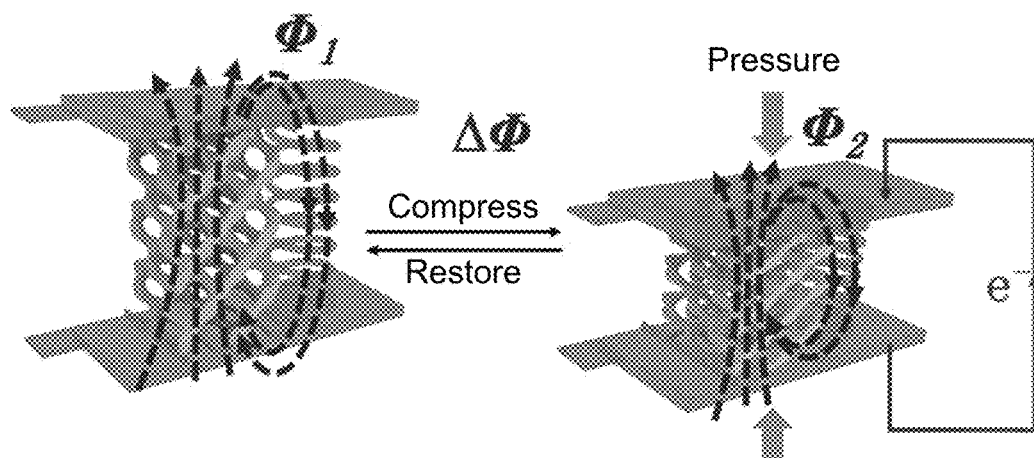
FIG. 5

FLEXIBLE PIEZOELECTRIC SENSOR BASED ON 4D PRINTING

CROSS-REFERENCE TO RELATED APPLICATION

This application is a divisional application of and claims the priority benefit of U.S. patent application Ser. No. 17/037,745, filed on Sep. 30, 2020, now pending, which claims the priority benefit of China Patent Application No. 202010158697.0, filed on Mar. 9, 2020. The entirety of each of the above-mentioned patent applications is hereby incorporated by reference herein and made a part of this specification.

BACKGROUND

Technical Field

The disclosure belongs to the technical field of additive manufacturing, and more specifically, relates to a flexible piezoelectric sensor based on 4D printing.

Description of Related Art

The concept of 4D printing has attracted much attention since it was proposed in 2013. 4D printing is defined as "3D printing+time" when it was proposed, that is, the components printed through 3D printing will be automatically changed in shape over time under the stimulation of external environment (such as thermal energy, magnetic field, electric field, humidity and pH value, etc.). The initial concept of 4D printing is mainly reflected in phenomenon demonstration, focusing on the change of the shape of the component, and it is regarded that 4D printing is the 3D printing of smart materials, and the key lies in applying smart materials in 3D printing. Based on such concept, a large number of patents related to 4D printing materials have been proposed. The 4D printed parts of related art can only change their shape over time under the stimulation of external environment.

As the number of related research increases, the concept and connotation of 4D printing have been specified more precisely. Currently the academically acknowledged concept of 4D printing is that the shape, property or functionality of 3D-printed components can undergo controllable changes over time or space being the fourth dimension under the stimulation preset in the external environment (such as thermal energy, water, light and pH value, etc.). Compared with the original 4D printing concept, the latest concept shows that the change of 4D-printed components is not only reflected in shape but also in property and functionality under the stimulation from the external environment, which enriches the content of 4D printing and helps the research related to 4D printing to involve from phenomenon demonstration to practical application. It is possible to realize functionalization and intelligentization as well as practical application only when the change of 4D-printed components are reflected in property and functionality. Therefore, it is necessary to explore how to realize the controllable changes that occur along with time and space, of property and functionalities of 4D printing formed parts.

However, regardless of the advancement of the concept of 4D printing, the research on 4D printing still focuses on the change in the shape of formed parts. In short, related art is still concerned about the deformation of the formed parts, ignoring or failing to achieve the change in property and functionality of the parts. This is mainly because that researchers habitually apply smart materials, such as shape memory materials, in traditional 3D printing process. Therefore, in order to achieve 4D printing for change of property and functionality, people should make a breakthrough in thoughts and adopt new ideas for manufacturing, so as to generate new property and functionality under the stimulation of external environment through material and structure designs, thereby realizing change in property and functionality.

SUMMARY

Technical Problem

In view of the above defects or needs for improvement of the related art, the disclosure provides a flexible piezoelectric sensor based on 4D printing, which utilize the additive manufacturing process to fabricate a piezoelectric sensor capable of achieving piezoelectric property-based on the ideology of a magnetic and electric material combination. The piezoelectric effect is derived from the principle of electromagnetic induction. That is, under the action of external force, the device can generate electrical signals, and has the functionality of sensing pressure. On basis of 3D printing, due to the material and structure design, the device obtains the functionality of piezoelectric property and sensing external pressure that cannot be achieved by the original magnetic part and conductive part individually, thus realizing the 4D printing capable of making changes in property and functionality.

In order to achieve the above-mentioned purpose, according to an aspect of the disclosure, a flexible piezoelectric sensor based on 4D printing is provided. The sensor includes a magnetic part and a conductive part, wherein:

The conductive part includes two substrates disposed opposite to each other and a spiral structure disposed between the two substrates. Both the two substrates and the spiral structure are made of conductive metal materials.

The magnetic part has a flexible porous structure and is arranged between the two substrates to generate a magnetic field.

When the substrate is subjected to external pressure, the spiral structure and the magnetic part are compressed simultaneously, the magnetic flux passing through the spiral structure changes, and the voltage of the two substrates changes, by measuring the voltage change of the two substrates to reflect the change of external pressure, the pressure measuring process is achieved.

More specifically, the raw material of the magnetic part is composite powder formed by mixing polymer powder and magnetic powder, wherein the polymer powder is, for example, thermoplastic polyurethane (TPU) or polydimethylsiloxane (PDMS), and the magnetic powder is, for example, neodymium iron boron (NdFeB) magnetic powder, iron chromium cobalt-based permanent magnet alloy powder or permanent ferrite powder.

More specifically, the mass fraction of the magnetic powder is 10% to 40%, which not only ensures the flexibility of the magnetic part, but also ensures the magnetism of the magnetic part.

More specifically, the ratio of the compression modulus of the spiral structure to the compression modulus of the magnetic part is 0.1 to 10.

More specifically, a slot is provided on the substrate for fixing the magnetic part.

More specifically, the piezoelectric sensor is a unit, and multiple units are connected in series or in parallel to obtain a multi-unit piezoelectric sensor. The multi-unit piezoelectric sensor is configured to amplify the signal of a single piezoelectric sensor.

Generally speaking, compared with related art, the above technical solutions conceived by the disclosure have the following advantageous effects:

1. In the disclosure, the magnetic part and the conductive part are fabricated by using a 3D printing process, and the two are formed separately. The final product obtained after assembly has piezoelectric properties, which not exist in the magnetic part and the conductive part, thereby achieving the effect of "1+1>2", that is, realizing 4D printing due to the change in property and functionality of 3D printed components;

2. The disclosure provides a new idea for material/structure design and manufacturing method for piezoelectric sensor. The additive manufacturing process significantly contributes to the quantitative control of the material/structure of the piezoelectric sensor, thereby accurately controlling the change of property and functionality of 4D-printed piezoelectric sensor.

BRIEF DESCRIPTION OF THE DRAWINGS

FIG. 3A and FIG. 3B are schematic diagrams of the structure of the magnetic part constructed according to the embodiment of the disclosure, wherein FIG. 3A is a three-dimensional computer-aided design (CAD) model of the magnetic part, FIG. 3B is the optical photograph of the fabricated magnetic part.

FIG. 4A and FIG. 4B are schematic diagrams of the structure of the conductive part constructed according to the embodiment of the disclosure, wherein FIG. 4A is a three-dimensional model of the conductive part, FIG. 4B is the optical photograph of the fabricated the conductive part.

FIG. 5 is a schematic diagram showing the principle of generating a piezoelectric signal by a piezoelectric sensor constructed according to an embodiment of the disclosure.

DESCRIPTION OF THE EMBODIMENTS

In order to make the purposes, technical solutions and advantages of the disclosure more comprehensible, the disclosure will be further described in detail below with reference to the accompanying drawings and embodiments. It should be understood that the specific embodiments described herein are only used to explain the disclosure, and are not intended to limit the disclosure. In addition, the technical features involved in the various embodiments of the disclosure described below can be combined with each other as long as there is no conflict with each other.

Figure 1:
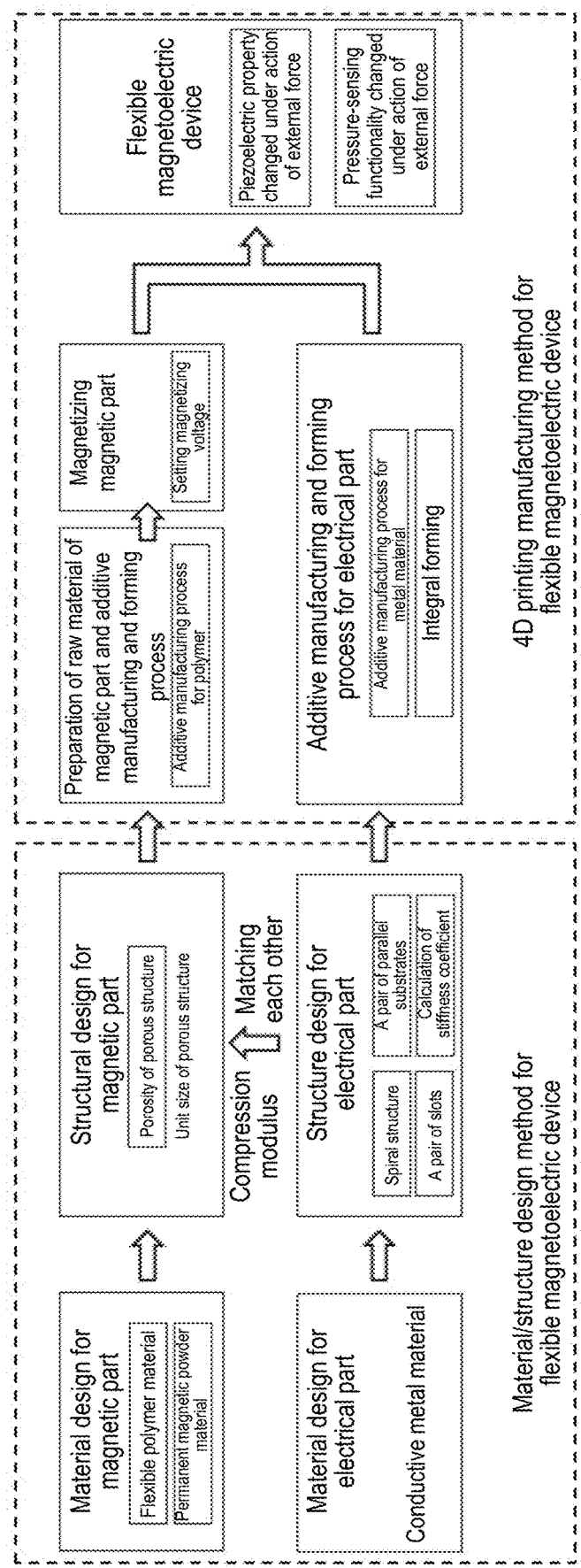
FIG. 1 is a schematic diagram of a fabrication process of a piezoelectric sensor constructed according to an embodiment of the disclosure.
Figure 2:
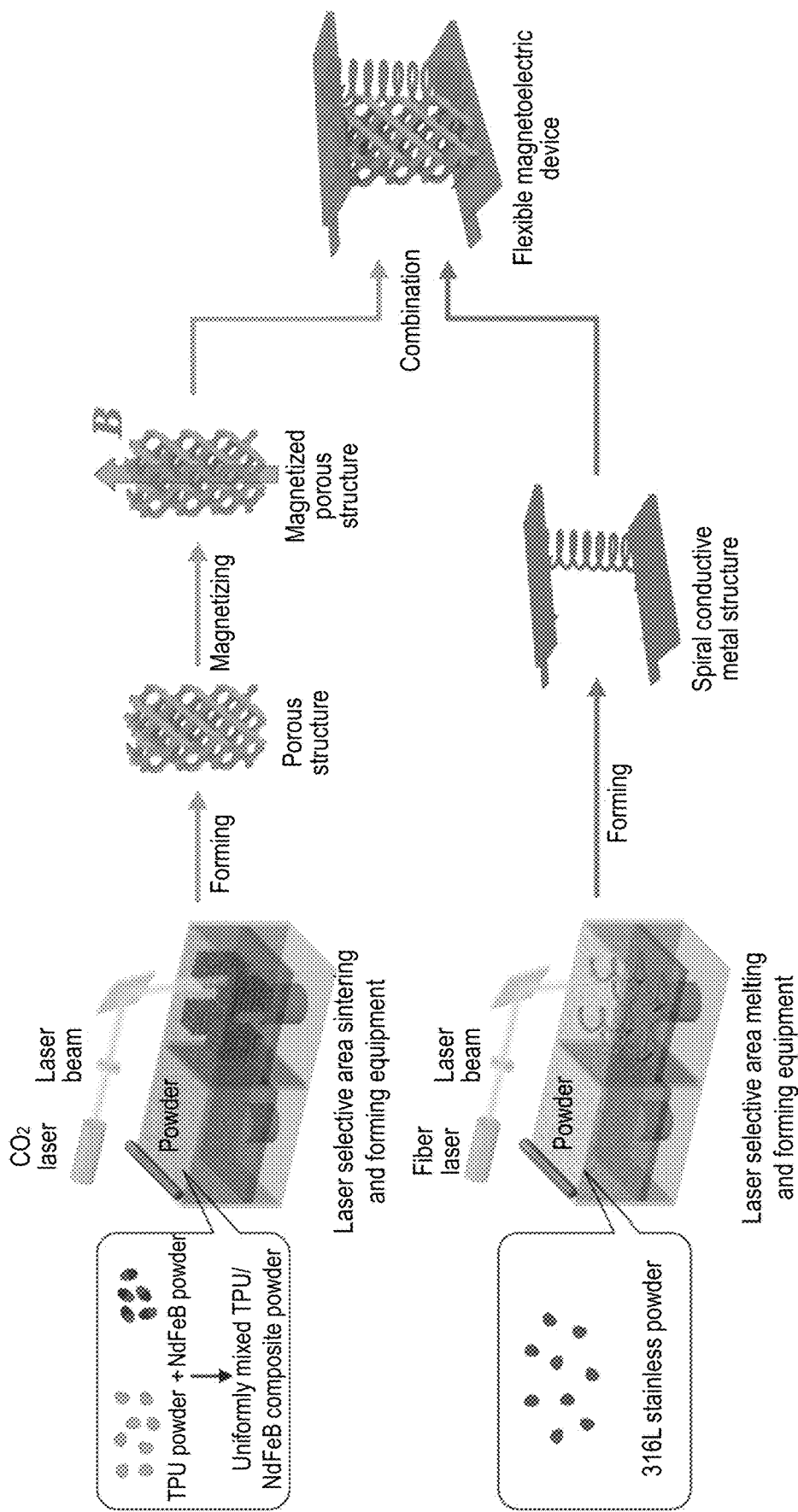
FIG. 2 is a schematic diagram of the structure and forming process of a piezoelectric sensor constructed according to an embodiment of the disclosure.

As shown in FIG. 1 and FIG. 2, a material/structure design method for 4D-printed flexible piezoelectric sensors involve both material and structure design. The piezoelectric sensor prepared by the disclosure is based on the idea of material combination. Therefore, the piezoelectric sensor includes a magnetic part and a conductive part prepared by using additive manufacturing, and the two parts are properly combined together to obtain a flexible piezoelectric sensor.

The material design of the magnetic part is flexible polymer material and permanent magnetic powder material. The mass fraction of the magnetic powder is 10% to 40%. The structure is designed as a three-dimensional periodic porous structure, which is particularly suitable for the additive manufacturing process and facilitates control of property. The conductive part is designed as a metal conductive material, the structure is designed as a combination of a spiral structure and two parallel substrates, and the height of the spiral structure and the three-dimensional periodic porous structure are the same. In this embodiment, a spring is adopted as the spiral structure.

The magnetic part should have the characteristics of generating a magnetic field, and the composite material of polymer material and magnetic powder is used as the raw material for additive manufacturing. The conductive part should have conductivity, materials with excellent conductivity (mainly metal materials) are adopted as raw materials for additive manufacturing. In order to achieve flexibility of device and facilitate compression of device, the polymer material is selected from materials with a low modulus and is designed as a porous structure to leave room for compression. By calculating and obtaining the compression modulus of the porous structure, the ratio of the compression modulus of the magnetic porous structure and the compression modulus of the metal conductive part (stiffness coefficient of the spring part is k) should be 0.1 to 10. The stiffness coefficient k of the spiral structure is calculated according to the following formula, which can provide a basis for the structure parameters adopted for the spiral structure.

$$k = \frac{Gd^4}{8nD^3},$$

wherein G is the shear modulus of the selected metal material, d is the wire diameter of the spring, n is the effective number of spring turns, and D is the midline diameter of the spring spiral.

Two parallel substrates are designed at both ends of the spring to facilitate the application of external pressure. The height of the two parallel substrates is the height of the porous structure of the magnetic polymer, so that the magnetic part is tightly attached to the two parallel substrates, and a pair of slots are designed on the parallel substrates with the same width as the width of the magnetic part, such that the magnetic part will not move relative to the parallel substrate during the compression process.

According to another aspect of the disclosure, the disclosure provides a 4D printing method for manufacturing of a flexible piezoelectric sensor, the method includes the following steps:

(1) Prepare raw materials for the magnetic part and perform the additive manufacturing and forming process. The flexible polymer material used for the magnetic part is, for example, thermoplastic polyurethane (TPU), polydimethylsiloxane (PDMS) and other flexible materials with low modulus. The magnetic powder selected is, for example, neodymium iron boron (NdFeB) magnetic powder, iron chromium cobalt-based permanent magnetic alloy powder, permanent ferrite powder and other powder that can maintain permanent magnetism once they are magnetized. The additive manufacturing and forming process adopts the processes commonly used for polymer materials, such as selective laser sintering (SLS), fused deposition modelling (FDM), or photo-curing based on ultra violet. According to the additive manufacturing process that is adopted, the above selected raw materials are prepared into different forms, such as powder material suitable for SLS process, filament material suitable for FDM process and photosensitive resin material suitable for stereolithography apparatus (SLA) or digital light processing (DLP) process. Further, the porous structure designed above is formed by using optimized process parameters to obtain a magnetic part.

(2) The magnetic part is magnetized. The magnetic part obtained in step (1) is placed on the magnetizer, an appropriate magnetization voltage is set, and the magnetic part will obtain permanent magnetism at the moment that the switch is turned on. The direction of the magnetic field can be changed according to the different directions along which the magnetic part is placed on the magnetizer.

(3) The conductive part is formed by using the additive manufacturing and forming process. The material with excellent conductivity used for the conductive part is, for example, a metal material, such as stainless steel, aluminum alloy, copper alloy, or the like. Common metal additive manufacturing processes, such as selective laser melting (SLM), electron beam melting (EBM) and Laser engineered net shaping (LENS), and so on are adopted. Optimized parameters are adopted to form the spiral structure of the above conductive part as well as two parallel substrates and a pair of slots in an integrated manner, thereby obtaining a conductive part.

(4) The magnetic part and the conductive part are assembled to obtain a flexible piezoelectric sensor.

The 4D-printed piezoelectric sensor is a basic unit, by properly connecting the multiple piezoelectric sensors, the multiple-piezoelectric sensors are connected in series and parallel, then the piezoelectric signal can be amplified.

The preparation of the conductive part and the preparation of the magnetic part are separate. There is no sequential order for the preparation of the two. After the preparation of any of the two, the compression modulus of the part that has not be prepared can be determined according to the part that has been prepared.

The flexible piezoelectric sensor is deformed under the action of external pressure, and the magnetic flux passing through the spiral structure changes. According to Faraday's law of electromagnetic induction, a voltage is generated between two parallel substrates, and thus an electrical signal is generated, resulting in new piezoelectric properties. Moreover, the piezoelectric sensor has the functionality of sensing external pressure. In this manner, the property and functionality of the 4D-printed component are changed, thereby realizing 4D printing capable of making change in property and functionality.

In a specific embodiment, the unit size of the three-dimensional periodic porous structure is, for example, 3 mm to 5 mm, the volume fraction is, for example, 15% to 20%, and the height is, for example, 15 mm to 25 mm.

The length of the two parallel substrates is, for example, 35 mm to 45 mm, and the width thereof is, for example, 15 mm to 25 mm. The wire diameter d of the spring is, for example, 1 mm to 1.2 mm, the effective number of spring turns n is, for example, 4 to 8, and the midline diameter D of the spring spiral is, for example, 8 mm to 10 mm.

The disclosure will be further described below with reference to specific embodiments. The material/structure design method of flexible piezoelectric sensor:

The material of the magnetic part is TPU and NdFeB powder, the mass fraction of the NdFeB powder is 40%, the unit size of the adopted three-dimensional periodic porous structure (three-dimensional CAD model shown in FIG. 3A) is 5 mm, the volume fraction is 20%, the height is 20 mm. The material of the conductive part is 316L stainless steel, the height of the spring in the magnetic part (three-dimensional CAD model shown in FIG. 4A) is the same as the height of the porous structure, that is, 20 mm, the length of the two parallel substrates is 40 mm, and the width thereof is 20 mm. The wire diameter d of the spring is 1 mm, the effective number of spring turns n is, for example, 7, and the midline diameter D of the spring spiral is, for example, 8 mm Verification shows that the compression modulus of the conductive part and the magnetic part is 2.5, which is in the range of 0.1 to 10, so synchronous compression can be achieved.

As shown in FIG. 2, the 4D printing manufacturing method of the flexible piezoelectric sensor of this embodiment is performed as follows:

(1) Prepare raw materials for the magnetic part and perform the additive manufacturing and forming process. The magnetic part is formed by selective laser sintering (SLS) of the additive manufacturing process. Therefore, the raw material needs to be made into the form of powder as shown in FIG. 3A, the structure of the magnetic part is designed, and then the optimized process parameters are adopted to fabricate the magnetic part, the final magnetic part formed by the SLS process is shown in FIG. 3B.

(2) The magnetic part is magnetized. The magnetic part obtained in step (1) is placed on the magnetizer, an appropriate magnetization voltage is set, and the magnetic part will obtain permanent magnetism at the moment when the switch is turned on. The direction of the magnetic field can be changed according to the different directions along which the magnetic part is placed on the magnetizer.

(3) The conductive part is formed by using the additive manufacturing and forming process. The conductive part is formed of 316L stainless steel powder by the SLM process as shown in FIG. 4A. The structure of the conductive part is designed. Optimized parameters are adopted to form the spiral structure of the above conductive part as well as two parallel substrates and a pair of slots in an integrated manner, thereby obtaining a conductive part as shown in FIG. 4B.

(4) The magnetic part and the conductive part are assembled to obtain a flexible piezoelectric sensor.

Figure 6:
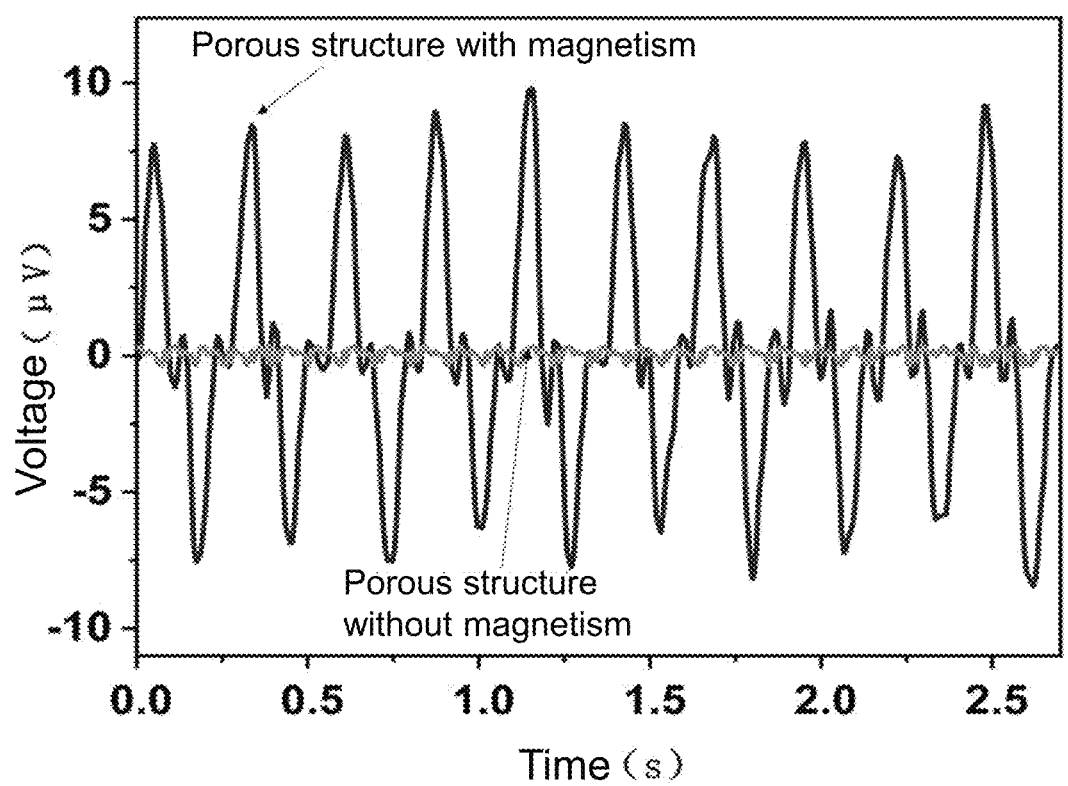
FIG. 6 illustrates a diagram of a piezoelectric signal of a piezoelectric sensor constructed according to an embodiment of the disclosure.

As shown in FIG. 5, the flexible piezoelectric sensor is deformed under the action of external pressure, and the magnetic flux passing through the spiral structure changes. According to Faraday's law of electromagnetic induction, a voltage is generated between two parallel substrates, and thus an electrical signal is generated, as shown in FIG. 6 which shows the generated electrical signal, resulting in new piezoelectric properties. Moreover, the piezoelectric sensor has the functionality of sensing external pressure. In this manner, the property and functionality of the 4D-printed component are changed, thereby realizing 4D printing capable of making change in property and functionality.

Those skilled in the art can easily understand that the above are only preferred embodiments of the disclosure and are not intended to limit the disclosure. Any modification, equivalent replacement and improvement made within the spirit and principle of the disclosure should fall within the scope of the disclosure.

What is claimed is:

1. A flexible piezoelectric sensor based on 4D printing, wherein the sensor comprises a magnetic part and a conductive part, wherein:
   the conductive part comprises two substrates disposed opposite to each other and a spiral structure disposed between the two substrates, both the two substrates and the spiral structure are formed of conductive metal materials;
   the magnetic part is a flexible porous structure and arranged between the two substrates to generate a magnetic field;
   when the two substrates are subjected to external pressure, the spiral structure and the magnetic part are compressed simultaneously, a magnetic flux passing through the spiral structure changes, and a voltage of the two substrates changes, by measuring a voltage change of the two substrates to reflect the change of external pressure, a pressure measuring process is achieved.

2. The flexible piezoelectric sensor based on 4D printing according to claim 1, wherein a raw material of the magnetic part is composite powder formed by mixing polymer powder and magnetic powder, wherein the polymer powder is thermoplastic polyurethane (TPU) or polydimethylsiloxane (TPMS), and the magnetic powder is neodymium iron boron (NdFeB) magnetic powder, iron chromium cobalt-based permanent magnet alloy powder or permanent ferrite powder.

3. The flexible piezoelectric sensor based on 4D printing according to claim 2, wherein a mass fraction of the magnetic powder is 10% to 40%, which not only ensures flexibility of the magnetic part, but also ensures magnetism of the magnetic part.

4. The flexible piezoelectric sensor based on 4D printing according to claim 1, wherein a ratio of a compression modulus of the spiral structure to a compression modulus of the magnetic part is 0.1 to 10.

5. The flexible piezoelectric sensor based on 4D printing according to claim 1, wherein a slot is provided on the substrate for fixing the magnetic part.

6. The flexible piezoelectric sensor based on 4D printing according to claim 1, wherein the piezoelectric sensor is a unit, and multiple units are connected in series or in parallel to obtain a multi-unit piezoelectric sensor, the multi-unit piezoelectric sensor is configured to amplify a signal of a single piezoelectric sensor.

* * * * *